(12) United States Patent
Park et al.

(10) Patent No.: US 11,223,012 B2
(45) Date of Patent: Jan. 11, 2022

(54) VARIABLE RESISTANCE SEMICONDUCTOR DEVICE HAVING OXIDATION-RESISTANT ELECTRODE

(71) Applicant: SK hynix Inc., Icheon-si (KR)

(72) Inventors: Woo-Young Park, Yongin-si (KR); Young-Seok Ko, Suwon-si (KR); Soo-Gil Kim, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 20 days.

(21) Appl. No.: 16/577,290

(22) Filed: Sep. 20, 2019

(65) Prior Publication Data

US 2020/0194667 A1 Jun. 18, 2020

(30) Foreign Application Priority Data

Dec. 14, 2018 (KR) .................. 10-2018-0162196

(51) Int. Cl.
*H01L 47/00* (2006.01)
*H01L 45/00* (2006.01)
*H01L 27/24* (2006.01)

(52) U.S. Cl.
CPC ...... *H01L 45/1233* (2013.01); *H01L 27/2409* (2013.01); *H01L 27/2418* (2013.01); *H01L 27/2427* (2013.01); *H01L 45/06* (2013.01); *H01L 45/08* (2013.01); *H01L 45/146* (2013.01); *H01L 45/147* (2013.01); *H01L 45/1608* (2013.01)

(58) Field of Classification Search
CPC combination set(s) only.
See application file for complete search history.

(56) References Cited

U.S. PATENT DOCUMENTS

| | | | |
|---|---|---|---|
| 8,975,613 B1 * | 3/2015 | Kuse | H01L 45/1233 257/4 |
| 9,231,203 B1 | 1/2016 | Tendulkar et al. | |
| 9,276,210 B1 * | 3/2016 | Tendulkar | H01L 45/16 |
| 9,876,054 B1 * | 1/2018 | Apodaca | H01L 27/2427 |
| 2012/0313063 A1 * | 12/2012 | Wang | H01L 45/1608 257/2 |
| 2013/0187110 A1 * | 7/2013 | Tendulkar | H01L 45/08 257/2 |
| 2014/0117303 A1 * | 5/2014 | Wang | H01L 45/16 257/4 |
| 2014/0166960 A1 * | 6/2014 | Nardi | H01L 45/146 257/4 |
| 2016/0358976 A1 * | 12/2016 | Eun | H01L 27/2463 |
| 2017/0352807 A1 * | 12/2017 | Ha | H01L 45/165 |

* cited by examiner

*Primary Examiner* — Niki H Nguyen

(57) ABSTRACT

A variable resistance semiconductor device includes a lower conductive wiring; a bottom electrode over the lower conductive wiring; a selection element pattern over the bottom electrode; a first intermediate electrode over the selection element pattern; a second intermediate electrode over the first intermediate electrode; a variable resistance element pattern over the second intermediate electrode; a top electrode over the variable resistance element pattern; and an upper conductive wiring over the top electrode. The first intermediate electrode includes a first material. The second intermediate electrode includes a second material which has a better oxidation resistance and a higher work function than the first material.

23 Claims, 15 Drawing Sheets

VARIABLE RESISTANCE SEMICONDUCTOR DEVICE HAVING OXIDATION-RESISTANT ELECTRODE

CROSS-REFERENCE TO RELATED APPLICATION

This application claims priority under 35 U.S.C. § 119 to Korean Patent Application No. 10-2018-0162196 filed on Dec. 14, 2018, which is incorporated herein by reference in its entirety.

BACKGROUND

1. Field

Exemplary embodiments relate to a variable resistance semiconductor device which has an oxidation-resistant electrode.

2. Discussion of the Related Art

A variable resistance semiconductor device has attracted attention as an SCM (storage class memory) device because it has low production cost, is relatively simple to manufacture, has excellent yield and scalability, and has advantages of both a DRAM and a flash memory. Also, the variable resistance semiconductor device may be used in mobile devices due to its low power consumption and high degree of integration. However, the use of a variable resistance semiconductor device in a 3D cross-point structure, for example, includes a selector device to resolve the sneak current and interference between adjacent memory cells, and solutions are still in development with respect to sensing errors and sneak current so that the device can be widely used as a high integration and low power consumption applications.

SUMMARY

Various embodiments are directed to a variable resistance semiconductor device with an improved voltage sensing margin.

Also, various embodiments are directed to a variable resistance semiconductor device with a low switching failure rate.

Further, various embodiments are directed to a method for manufacturing the variable resistance semiconductor device.

In an embodiment, a variable resistance semiconductor device may include: a lower conductive wiring; a bottom electrode over the lower conductive wiring; a selection element pattern over the bottom electrode; a first intermediate electrode over the selection element pattern; a second intermediate electrode over the first intermediate electrode; a variable resistance element pattern over the second intermediate electrode; a top electrode over the variable resistance element pattern; and an upper conductive wiring over the top electrode. The first intermediate electrode may include a first material. The second intermediate electrode may include a second material which has a better oxidation resistance and a higher work function than the first material.

The first material may include at least one among titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) and amorphous carbon (α-C). The second material may include ruthenium (Ru), cobalt (Co), palladium (Pd), nickel (Ni), rhenium (Re), iridium (Ir), platinum (Pt), aurum (Au), rhodium (Rh), lead (Pb), iridium oxide ($IrO_2$), ruthenium oxide ($RuO_2$), rhenium oxide ($ReO_2$), titanium nitride (TiN), tantalum nitride (TaN), tungsten nitride (WN), tantalum silicon nitride (TaSiN), titanium silicon nitride (TiSiN), ruthenium-hafnium (RuHf), ruthenium-tantalum (RuTa), ruthenium-titanium (RuTi), ruthenium-zirconium (RuZr), ruthenium-silicon (RuSi), iridium-hafnium (IrHf), iridium tantalum (IrTa), iridium-titanium (IrTi), iridium-zirconium (IrZr), iridium-silicon (IrSi).

The bottom electrode may include one among titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) and amorphous carbon (α-C).

The selection element pattern may include one among an Ovonic threshold switching (OTS) material layer, a Schottky diode, a metal-insulator-metal (MIM), a PN junction diode, a metal-insulator transition (MIT) material layer, a mixed ionic electronic conduction (MIEC) material layer and a silicon doped with arsenic (As) ions.

The variable resistance element pattern may include one among a metal oxide such as hafnium oxide ($HfO_2$), tantalum oxide ($Ta_2O_5$), titanium oxide ($TiO_2$), zirconium oxide ($ZrO_2$), aluminum oxide ($Al_2O_3$), gadolinium oxide ($Gd_2O_3$), lanthanum oxide ($La_2O_3$) or ytterbium oxide ($Yb_2O_3$), silicon oxide ($SiO_2$), a metal oxide containing at least two metals among hafnium (Hf), tantalum (Ta), titanium (Ti), zirconium (Zr), tungsten (W), aluminum (Al), gadolinium (Gd), lanthanum (La), ytterbium (Yb) and iridium (Ir), a chalcogenide-based alloy; or a conductive bridge RAM (CBRAM) material.

The variable resistance semiconductor device may further include a reservoir pattern interposed between the variable resistance element pattern and the top electrode. The reservoir pattern may include one among hafnium (Hf), tantalum (Ta), titanium (Ti), silicon (Si), titanium oxide (TiOx), tungsten (W), and combinations thereof.

The variable resistance semiconductor device may further include a resistive barrier layer interposed between the bottom electrode and the selection element pattern. The resistive barrier layer may include an oxide containing at least one among silicon (Si), hafnium (Hf), tantalum (Ta), titanium (Ti), zirconium (Zr) and aluminum (Al).

The variable resistance semiconductor device may further include a first spacer conformally formed on sidewalls of the top electrode and the variable resistance element pattern. The first spacer may include a dielectric material.

The variable resistance semiconductor device may further include a second spacer conformally formed on sidewalls of the bottom electrode, the selection element pattern, the first intermediate electrode, the second intermediate electrode and the first spacer. The second spacer may include a dielectric material.

In an embodiment, a variable resistance semiconductor device may include: a lower conductive wiring; a bottom electrode over the lower conductive wiring; a selection element pattern over the bottom electrode; a lower intermediate electrode over the selection element pattern; an upper intermediate electrode over the lower intermediate electrode; a variable resistance element pattern over the upper intermediate electrode; a top electrode over the variable resistance element pattern; and an upper conductive wiring over the top electrode. The lower intermediate electrode may include one of titanium nitride and amorphous carbon. The upper intermediate electrode may include one of ruthenium and ruthenium oxide.

The variable resistance semiconductor device may further include an adhesion layer between the lower intermediate electrode and the selection element pattern. The bottom electrode may include titanium nitride (TiN) or amorphous carbon (α-carbon).

The variable resistance semiconductor device may further include a reservoir pattern interposed between the variable resistance element pattern and the top electrode. The reservoir pattern may include one among hafnium (Hf), tantalum (Ta), titanium (Ti), silicon (Si), titanium oxide (TiOx), tungsten (W), and combinations thereof.

The variable resistance semiconductor device may further include a resistive barrier layer interposed between the bottom electrode and the selection element pattern. The resistive barrier layer may include an oxide containing at least one among silicon (Si), hafnium (Hf), tantalum (Ta), titanium (Ti), zirconium (Zr) and aluminum (Al).

The variable resistance semiconductor device may further include a first spacer conformally formed on sidewalls of the top electrode and the variable resistance element pattern. The first spacer may include a dielectric material.

The variable resistance semiconductor device may further include a second spacer conformally formed on sidewalls of the bottom electrode, the selection element pattern, the lower intermediate electrode, the upper intermediate electrode and the first spacer. The second spacer may include a dielectric material.

In an embodiment, a variable resistance semiconductor device may include: a lower conductive wiring; a bottom electrode over the lower conductive wiring; a selection element pattern over the bottom electrode; a lower intermediate electrode over the selection element pattern; an upper intermediate electrode over the lower intermediate electrode; a resistance element pattern over the upper intermediate electrode; a top electrode over the resistance element pattern; and an upper conductive wiring over the top electrode. The upper intermediate electrode may include a material which has a better oxidation resistance and a higher work function than the lower intermediate electrode.

The variable resistance semiconductor device may further include a reservoir pattern interposed between the resistance element pattern and the top electrode. The reservoir pattern may include one among hafnium (Hf), tantalum (Ta), titanium (Ti), silicon (Si), titanium oxide (TiOx), tungsten (W), and combinations thereof.

The variable resistance semiconductor device may further include a resistive barrier layer interposed between the bottom electrode and the selection element pattern. The resistive barrier layer may include an oxide containing at least one among silicon (Si), hafnium (Hf), tantalum (Ta), titanium (Ti), zirconium (Zr) and aluminum (Al).

The variable resistance semiconductor device may further include a first spacer conformally formed on sidewalls of the top electrode and the resistance element pattern; and a second spacer conformally formed on sidewalls of the bottom electrode, the selection element pattern, the lower intermediate electrode, the upper intermediate electrode and the first spacer. The first and second spacers may include silicon nitride.

The variable resistance semiconductor device according to the technical idea of the disclosure may have an improved voltage sensing margin and a low switching failure rate.

In an embodiment, a method of forming a variable resistance memory device, the method comprising: forming a lower conductive wiring; forming a bottom electrode over the lower conductive wiring; forming a selection element pattern over the bottom electrode; forming a lower intermediate electrode over the selection element pattern; forming an upper intermediate electrode over the lower intermediate electrode; forming a variable resistance element pattern over the upper intermediate electrode; forming a top electrode over the variable resistance element pattern; and forming an upper conductive wiring over the top electrode. The upper intermediate electrode has a better oxidation resistance and a higher work function than the lower intermediate electrode.

The method of forming a variable resistance memory device may further include forming a reservoir pattern between the variable resistance element pattern and the top electrode. The reservoir pattern may include one among hafnium (Hf), tantalum (Ta), titanium (Ti), silicon (Si), titanium oxide (TiOx), and tungsten (W).

The method of forming a variable resistance memory device may further include forming a resistive barrier layer between the bottom electrode and the selection element pattern. The resistive barrier layer may include an oxide containing at least one among silicon (Si), hafnium (Hf), tantalum (Ta), titanium (Ti), zirconium (Zr) and aluminum (Al).

The upper intermediate electrode comprises RuO2. The lower intermediate electrode comprises titanium nitride.

In an embodiment, a method of forming a variable resistance memory device, the method comprising: forming a selection element comprising a lower electrode, a selection element pattern and an intermediate electrode; and forming a resistance element comprising a variable resistance element pattern, a reservoir pattern and a top electrode. The intermediate electrode is comprised of a lower intermediate electrode and an upper intermediate electrode, and the upper intermediate electrode comprises ruthenium oxide (RuO2).

The lower intermediate electrode comprises a metal with a lower work function and a lower oxidation resistance compared to ruthenium oxide (RuO2). The lower intermediate electrode comprises titanium nitride.

DETAILED DESCRIPTION

Figure 1:
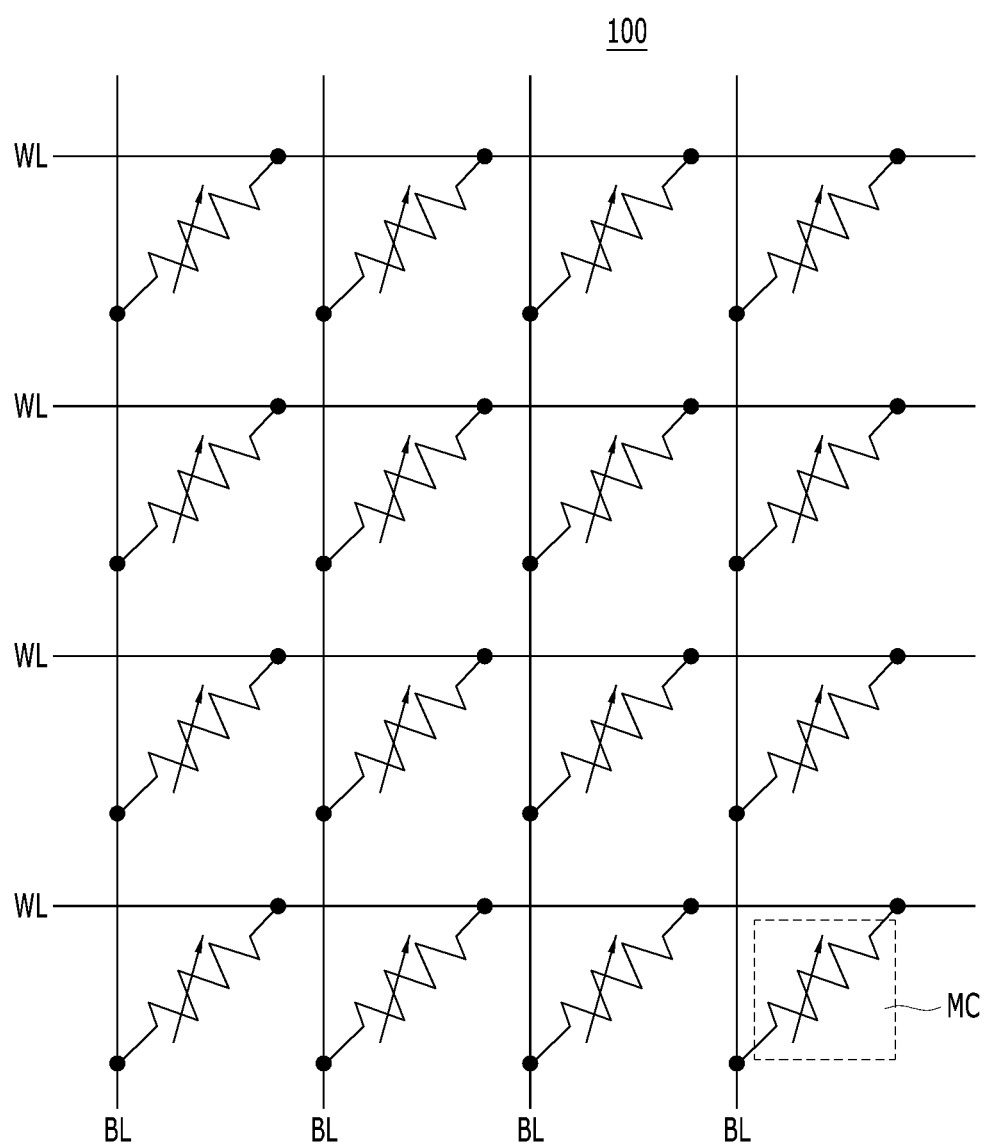
FIG. 1 is a conceptual circuit diagram illustrating a representation of a variable resistance semiconductor device in accordance with an embodiment of the disclosure.

In the disclosure, advantages, features and methods for achieving them will become more apparent after a reading of the following exemplary embodiments taken in conjunction with the drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

Terms used in this specification are used for describing various embodiments, and do not limit the disclosure. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

When one element is referred to as being 'connected to' or 'coupled to' another element, it may indicate that the former element is directly connected or coupled to the latter element or that another element is interposed therebetween. On the other hand, when one element is referred to as being 'directly connected to' or 'directly coupled to' another element, it may indicate that no element is interposed therebetween. Furthermore, 'and/or' includes each of described items and one or more combinations.

Throughout the specification, like reference numerals refer to like elements. Therefore, although the same or similar reference numerals are not mentioned or described in a corresponding drawing, the reference numerals may be described with reference to other drawings. Furthermore, although elements are not represented by reference numerals, the elements may be described with reference to other drawings.

FIG. 1 is a conceptual circuit diagram illustrating a representation of a variable resistance semiconductor device in accordance with an embodiment of the disclosure. Referring to FIG. 1, the variable resistance semiconductor device 100 may include word lines WL which extend in parallel or substantially in parallel in a first direction, for example, a row direction; bit lines BL which extend in parallel or substantially in parallel in a second direction that is perpendicular or substantially perpendicular to the first direction, for example, a column direction; and memory cell stacks MC which are disposed in areas or regions of actual or potential intersection between the word lines WL and the bit lines BL. The memory cell stacks MC may include variable resistance elements. The word lines WL and the bit lines BL may be interchangeable.

Figure 2:
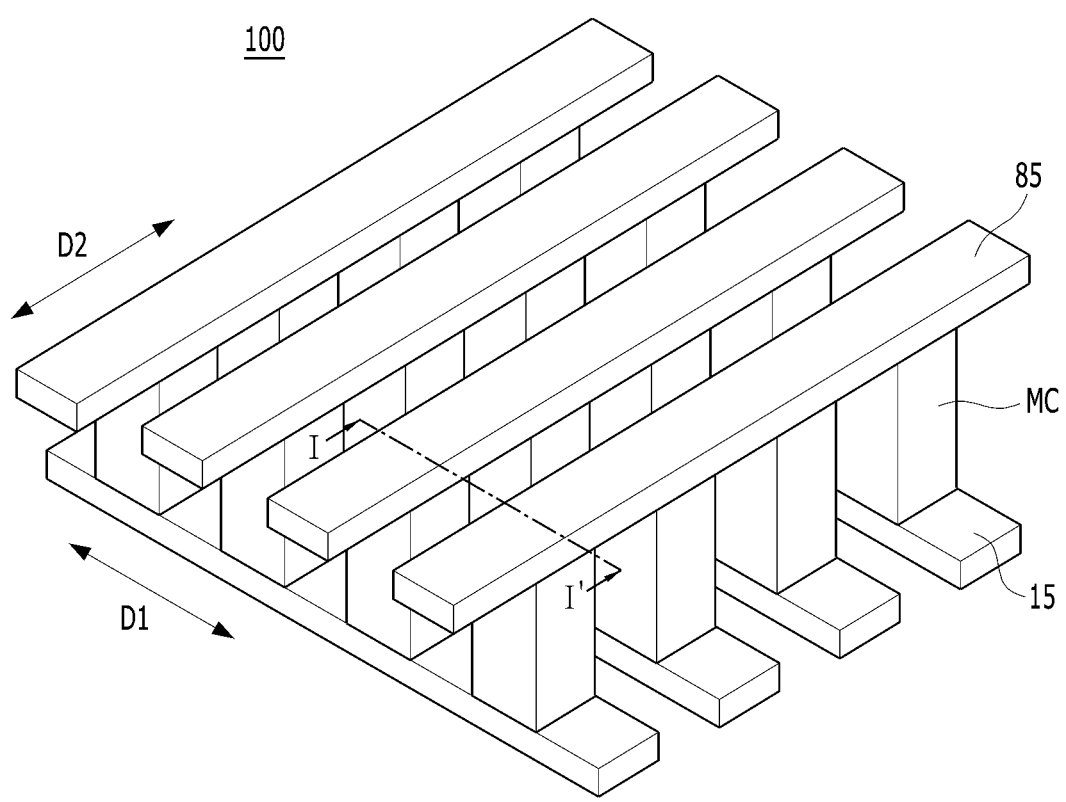
FIG. 2 is a conceptual three-dimensional perspective view illustrating an example of a variable resistance semiconductor device in accordance with embodiments of the disclosure.

FIG. 2 is a conceptual three-dimensional perspective view illustrating an example of a variable resistance semiconductor device 100 in accordance with embodiments of the disclosure. In FIG. 2, a variable resistance semiconductor device 100 may include lower conductive wirings 15, upper conductive wirings 85 and memory cell stacks MC. The memory cell stacks MC may electrically connect the lower conductive wirings 15 and the upper conductive wirings 85. The lower conductive wirings 15 may extend in parallel or substantially in parallel in a first horizontal direction D1, and may represent word lines WL. The upper conductive wirings 85, which may represent bit lines BL, may extend in parallel or substantially in parallel in a second horizontal direction D2, perpendicular or substantially perpendicular to the first horizontal direction D1. That is to say, from a top view or a plan view, the lower conductive wirings 15 and the upper conductive wirings 85 may be seen as intersecting with each other like a mesh-like or lattice-like shape. The memory cell stacks MC may be disposed within areas or regions where the lower conductive wirings 15 and the upper conductive wirings 85 intersect with each other from a plan view. The memory cell stacks MC may include a plurality of stacked components, and may have a pillar-like, rod-like, or cylinder-like shape with varying cross-sectional geometries.

In another embodiment of the disclosure, the lower conductive wirings 15 may be bit lines BL, and the upper conductive wirings 85 may be the word lines WL. In some embodiments, the variable resistance semiconductor device is part of a 3D cross-point structure.

Figure 3A:
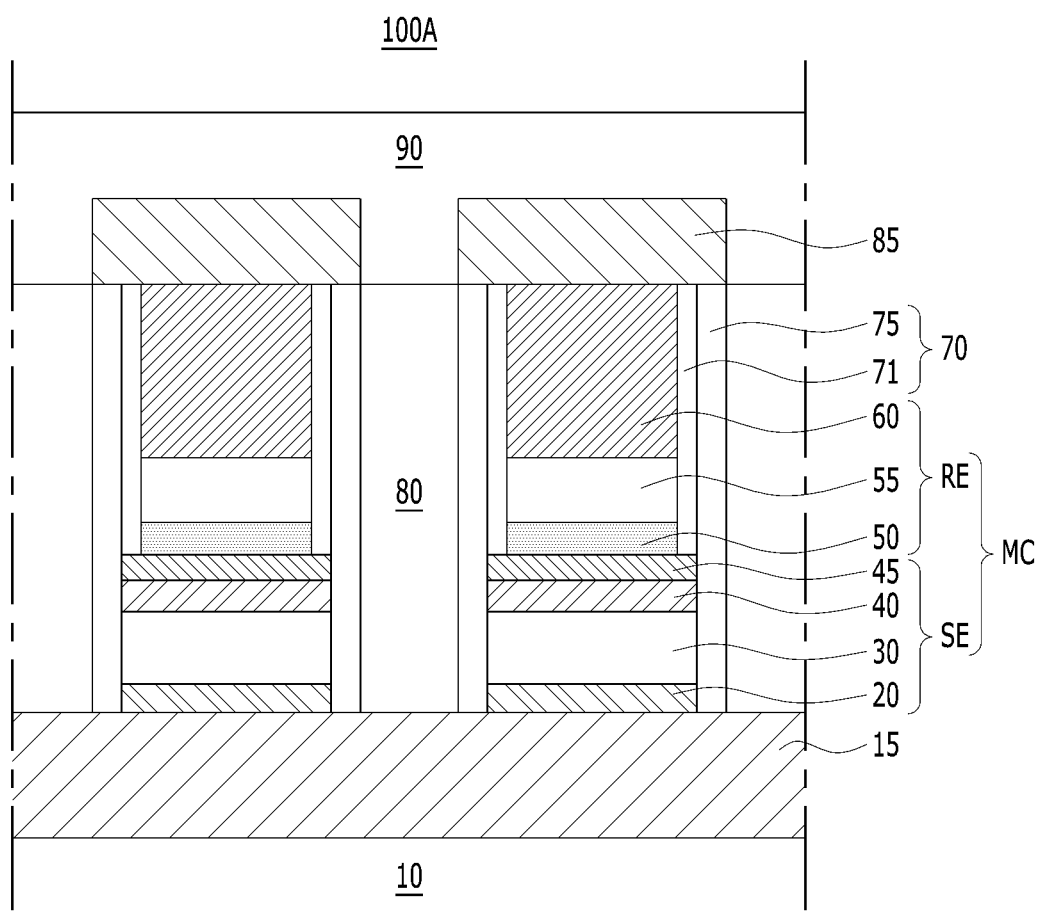
FIGS. 3A to 3D are longitudinal cross-sectional views taken along the line I-I' of FIG. 2, conceptually illustrating variable resistance semiconductor devices in accordance with embodiments of the disclosure.

FIG. 3A is a longitudinal cross-sectional view taken along the line I-I' of FIG. 2, conceptually illustrating a variable resistance semiconductor device 100A in accordance with an embodiment of the disclosure. Referring to FIG. 3A, the variable resistance semiconductor device 100A may include a lower conductive wiring 15 disposed on a lower layer 10, a memory cell stack MC, a spacer 70, an interlayer dielectric layer 80, an upper conductive wiring 85, and a capping dielectric layer 90.

The lower layer 10 may be a substrate or a lower dielectric base layer. For example, the lower layer 10 may be a dielectric layer on a silicon wafer or a dielectric layer on an epitaxially grown silicon layer. Thus, the lower layer 10 may include silicon nitride (SiN), silicon oxide ($SiO_2$), silicon oxynitride (SiON) or any other dielectric material.

The lower conductive wiring 15 may be disposed on the lower layer 10. Referring to FIG. 2, the lower conductive wiring 15 may be a word line WL. In other words, the lower conductive wiring 15 may extend in the first horizontal direction D1. The lower conductive wiring 15 may include a doped silicon, a metal, a metal silicide, a metal compound, a metal alloy or any other conductive material.

The memory cell stack MC may be disposed on the lower conductive wiring 15. By way of non-limiting examples, the memory cell stack MC may take a pillar-like, rod-like or cylinder-like shape. The memory cell stack MC may include a selection element SE and a resistance element RE sequentially disposed on the lower conductive wiring 15 such that the selection element SE is located at a lower portion of the memory cell stack MC and the resistance element RE is located at an upper portion. In another embodiment of the disclosure, the memory cell stack MC may include a resistance element RE and a selection element SE sequentially disposed on the lower conductive wiring 15 such that the resistance element RE is located at a lower portion of the memory cell stack MC and the selection element SE is located at an upper portion.

The selection element SE may include a bottom electrode 20, a selection element pattern 30 which is disposed on the bottom electrode 20, a lower intermediate electrode 40 which is disposed on the selection element pattern 30, and an upper intermediate electrode 45 which is disposed on the lower intermediate electrode 40. [0050] The bottom electrode 20 may be electrically coupled to the lower conductive wiring 15. The bottom electrode 20 may have a substantially circular or polygonal cross-sectional shape. The bottom electrode 20 may be a conductor that includes at least one of titanium (Ti), tantalum (Ta) and carbon (C), and may have excellent adhesion to the lower conductive wiring 15. As non-limiting examples, the bottom electrode 20 may include titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) or amorphous carbon (α-C).

The selection element pattern 30 may allow or block current flow in the memory cell stack MC. The selection element pattern 30 may include at least one among an Ovonic threshold switching (OTS) material layer, a Schottky diode, a metal-insulator-metal (MIM), a PN junction diode, a metal-insulator transition (MIT) material layer, a mixed ionic electronic conduction (MIEC) material layer and any other material capable of selectively blocking current flow. As an example, the selection element pattern 30 may include silicon doped with arsenic (As) ions.

The lower intermediate electrode 40 may include a conductor having excellent adhesion force with the selection element pattern 30. The lower intermediate electrode 40 may include a conductor having at least one of titanium (Ti), tantalum (Ta) and carbon (C). In non-limiting examples, the lower intermediate electrode 40 may include titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) or amorphous carbon (α-C).

The upper intermediate electrode 45 may include a conductor having an excellent anti-oxidation characteristic and a work function relatively higher than the lower intermediate electrode 40. The upper intermediate electrode may include at least one among a metal such as ruthenium (Ru), cobalt (Co), palladium (Pd), nickel (Ni), rhenium (Re), iridium (Ir), platinum (Pt), aurum (Au), rhodium (Rh) or lead (Pb). As non-limiting examples, the upper intermediate electrode 45 may include a metal oxide such as iridium oxide ($IrO_2$), ruthenium oxide ($RuO_2$) or rhenium oxide ($ReO_2$); a metal nitride such as titanium nitride (TiN), tantalum nitride (TaN), tungsten nitride (WN), tantalum silicon nitride (TaSiN) or titanium silicon nitride (TiSiN); a metal alloy containing ruthenium (Ru) such as ruthenium-hafnium (RuHf), ruthenium-tantalum (RuTa), ruthenium-titanium (RuTi) or ruthenium-zirconium (RuZr); a ruthenium silicide such as ruthenium-silicon (RuSi); a metal alloy containing iridium (Ir) such as iridium-hafnium (IrHf), iridium tantalum (IrTa), iridium-titanium (IrTi) or iridium-zirconium (IrZr); or an iridium silicide such as iridium-silicon (IrSi).

Referring again to FIG. 3A, the resistance element RE may include a variable resistance element pattern 50 which is disposed on the upper intermediate electrode 45 of the selection element SE, a reservoir pattern 55 which is disposed on the variable resistance element pattern 50, and a top electrode 60 which is disposed on the reservoir pattern 55.

The variable resistance element pattern 50 may include a variable resistance material, of which the resistance value varies depending on oxygen content. The variable resistance element pattern 50 may include at least one among a single-metal oxide (such as hafnium oxide ($HfO_2$), tantalum oxide ($Ta_2O_5$), titanium oxide ($TiO_2$), zirconium oxide ($ZrO_2$), aluminum oxide ($Al_2O_3$), gadolinium oxide ($Gd_2O_3$), lanthanum oxide ($La_2O_3$), ytterbium oxide ($Yb_2O_3$), and silicon oxide ($SiO_2$)), or a complex metal oxide containing at least two different metals (such as hafnium (Hf), tantalum (Ta), titanium (Ti), zirconium (Zr), tungsten (W), aluminum (Al), gadolinium (Gd), lanthanum (La), ytterbium (Yb) and iridium (Ir)). In another embodiment, the variable resistance element pattern 50 may include a phase change material including a chalcogenide-based alloy such as GST (GeSbTe). In a further embodiment, the variable resistance element pattern 50 may include a conductive bridge RAM (CBRAM) material.

The reservoir pattern 55 may include a material capable of providing oxygen atoms or oxygen ions to the variable resistance element pattern 50, or receiving and storing oxygen atoms or oxygen ions from the variable resistance element pattern 50. The reservoir pattern 55 may include a redox metal or conductor such as hafnium (Hf), tantalum (Ta), titanium (Ti) or silicon (Si). For example, the reservoir pattern 55 may include at least one among hafnium (Hf), tantalum (Ta), titanium (Ti), silicon (Si), titanium oxide (TiOx), tungsten (W), and oxides thereof, and may include combinations thereof. In detail, the reservoir pattern 55 may include hafnium-titanium (HfTi), hafnium-tantalum (HfTa), hafnium-silicon (HfSi), hafnium-tungsten (HfW), titanium-tantalum (TiTa), titanium-silicon (TiSi), titanium-tungsten (TiW), oxides thereof, or various other combinations. In another embodiment of the disclosure, the reservoir pattern may include at least one among hafnium oxide (HfOx), tantalum oxide (TaOx), titanium oxide (TiOx), silicon oxide (SiOx), titanium oxide (TiOx), and tungsten oxide (WOx), and/or combinations thereof. The movement of oxygen atoms or oxygen ions in the variable resistance element pattern 50 to be stored in the reservoir pattern 55, or the migration of oxygen atoms or oxygen ions stored in the reservoir pattern 55 to the variable resistance element pattern 50 may correspond to a low resistance state and a high resistance state in the variable resistance element pattern 50.

The top electrode 60 may include a conductor having an excellent adhesion force with the reservoir pattern 55. The top electrode 60 may include a conductor having at least one of titanium (Ti), tantalum (Ta) and carbon (C). By way of non-limiting examples, the top electrode 60 may include titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) and amorphous carbon (α-C).

The spacer 70 may include an inner spacer 71 which surrounds the sidewalls or outer surfaces of the resistance element RE, and an outer spacer 75 which surrounds the sidewalls or outer surfaces of the inner spacer 71 and the selection element SE. The inner spacer 71 and the outer spacer 75 may include silicon nitride (SiN). Because the inner spacer 71 and the outer spacer 75 include the same material, for example, silicon nitride (SiN), in such embodiments the inner spacer 71 and the outer spacer 75 may function or operate as a single spacer, as if there is no interface therebetween. In some embodiments, the inner spacer 71 and the outer spacer 75 may each include a plurality of dielectric layers. For example, the inner spacer 71 and the outer spacer 75 may each have a double-layered structure (N/O or O/N) of silicon nitride (SiN)/silicon oxide (S102), or silicon oxide (S102)/silicon nitride (SiN); or a three-layered structure (N/O/N) of silicon nitride (SiN)/silicon oxide (S102)/silicon nitride (SiN). In further embodiments, the inner spacer 71 and the outer spacer 75 may each include at least four layers of various dielectric materials.

The interlayer dielectric layer 80 may fill the areas and spaces between memory cell stacks MC. The interlayer dielectric layer 80 may include silicon oxide (S102).

The upper conductive wiring 85 may be formed on the memory cell stack MC and be electrically coupled to the top electrode 60. Referring to FIG. 2, an upper conductive wiring 85 may be one among the bit lines BL. In other words, the upper conductive wirings 85 may extend in parallel or substantially in parallel in the second horizontal direction D2. The upper conductive wirings 85 may include a doped silicon, a metal, a metal silicide, a metal compound, a metal alloy or any other conductive material.

The capping dielectric layer 90 may be disposed on or over the upper conductive wiring 85. The capping dielectric layer 90 may include silicon nitride (SiN), silicon oxide (S1O2), silicon oxynitride (SiON) or any other dielectric material.

The side surfaces or edges of the bottom electrode 20, the selection element pattern 30, the lower intermediate electrode 40 and the upper intermediate electrode 45 may be vertically aligned to be substantially flush with each other such that the outer surface of the resistance element RE is substantially smooth. The side surfaces or edges of the bottom electrode 20, the selection element pattern 30, the lower intermediate electrode 40, and the upper intermediate electrode 45 may be aligned to be substantially flush with the outer surface of the inner spacer 71 to form a pillar-like structure between the lower conductive wiring 15 and the upper conductive wiring 85 with a substantially smooth outer surface. The side surfaces or edges of the variable resistance element pattern 50, the reservoir pattern 55 and the top electrode 60 may be vertically aligned to be substantially flush with each other such that the outer surface of the resistance element RE is substantially smooth.

In the memory cell stack MC structure, a selection element is used to resolve the sneak current and interference between the adjacent memory cells and the variable resistance memory device. The lack of data sensing margin between the selection elements and resistance elements can lead to sensing errors, making it difficult to use the variable resistance memory devices in high-density memory devices. In particular, when the selection element turns on, the snap-back phenomenon of the voltage drop causes the voltage sensing margin ΔVrd to further deteriorate (where ΔVrd is the voltage difference between the switching voltage (Vsw) of and the threshold voltage (Vth). The greater the ΔVrd, the fewer the sensing errors. Therefore, to commercialize the high-density RRAM device, methods are disclosed herein to increase ΔVrd and to reduce reset switching fails, which can occur due to oxidation and/or the formation of a parasitic filament between electrodes.

In variable resistance memory devices, the movement of oxygen between an intermediate electrode and the resistance element may result in the oxidation of the intermediate electrode, leading to a snap-back phenomenon due to the voltage drop across the intermediate electrode. Such a snap-back phenomenon may decrease the difference between a switching voltage Vsw and a threshold voltage Vth of the selection element, thereby decreasing a voltage sensing margin ΔVrd.

In embodiments of the disclosure, methods are disclosed to increase ΔVrd. For example, the material used in upper intermediate electrode 45 may block movement of oxygen between the lower intermediate electrode 40 and the variable resistance element pattern 50, thereby preventing the lower intermediate electrode 40 from being oxidized. The upper intermediate electrode 45, in addition to having an excellent oxidation resistance, may also be selected to have a high work function that further minimizes the occurrence of a voltage drop in the lower intermediate electrode 40 and the upper intermediate electrode 45. Thus, methods of reducing the snap-back phenomenon or improving the voltage sensing margin ΔVrd involve the inclusion of a second intermediate electrode disposed between a first intermediate electrode and a selection element pattern 50.

Figure 3B:
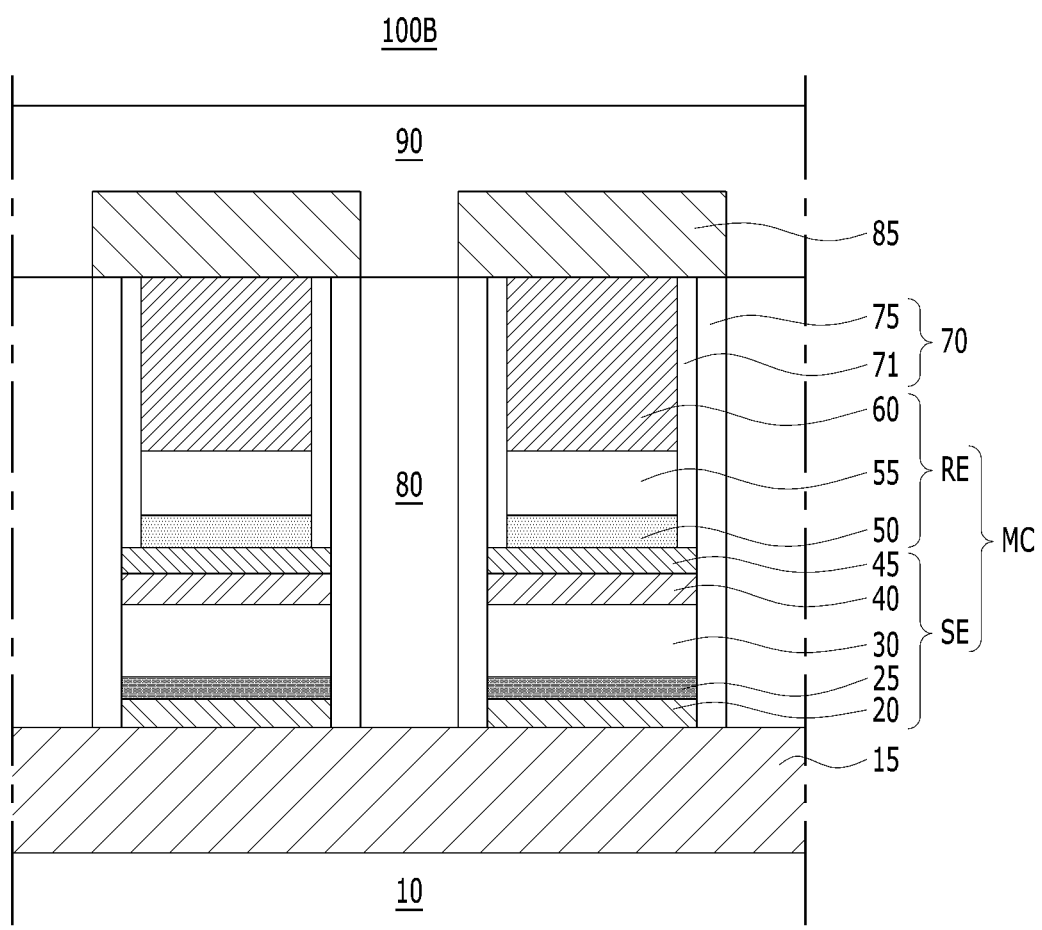

FIG. 3B is a longitudinal cross-sectional view taken along the line I-I' of FIG. 2, conceptually illustrating a variable resistance semiconductor device 100B in accordance with an embodiment of the disclosure The variable resistance semiconductor device 100B may further include a resistive barrier layer 25 which is interposed between the bottom electrode 20 and the selection element pattern 30, as compared to the variable resistance semiconductor device 100A of FIG. 3A. The remaining components of variable resistance semiconductor device 100B are substantially the same or identical to those described above for variable resistance semiconductor device 100A, and so will not be repeated here to reduce repetition. The resistive barrier layer 25 may prevent and mitigate an over-shooting phenomenon by parasitic capacitance or the like. The resistive barrier layer 25 may have dielectric properties and may act as a resistance component. The resistive barrier layer 25 may include silicon oxide ($SiO_2$). Alternatively, the resistive barrier layer 25 may include a single-metal oxide such as hafnium oxide ($HfO_2$), tantalum oxide ($Ta_2O_5$), titanium oxide ($TiO_2$), zirconium oxide ($ZrO_2$) or aluminum oxide ($Al_2O_3$), or a complex metal oxide containing at least two metals among hafnium (Hf), tantalum (Ta), titanium (Ti), zirconium (Zr) and aluminum (Al). The side surfaces of the bottom electrode 20, the resistive barrier layer 25, the selection element pattern 30, the lower intermediate electrode 40 and the upper intermediate electrode 45 may be substantially vertically aligned.

Figure 3C:
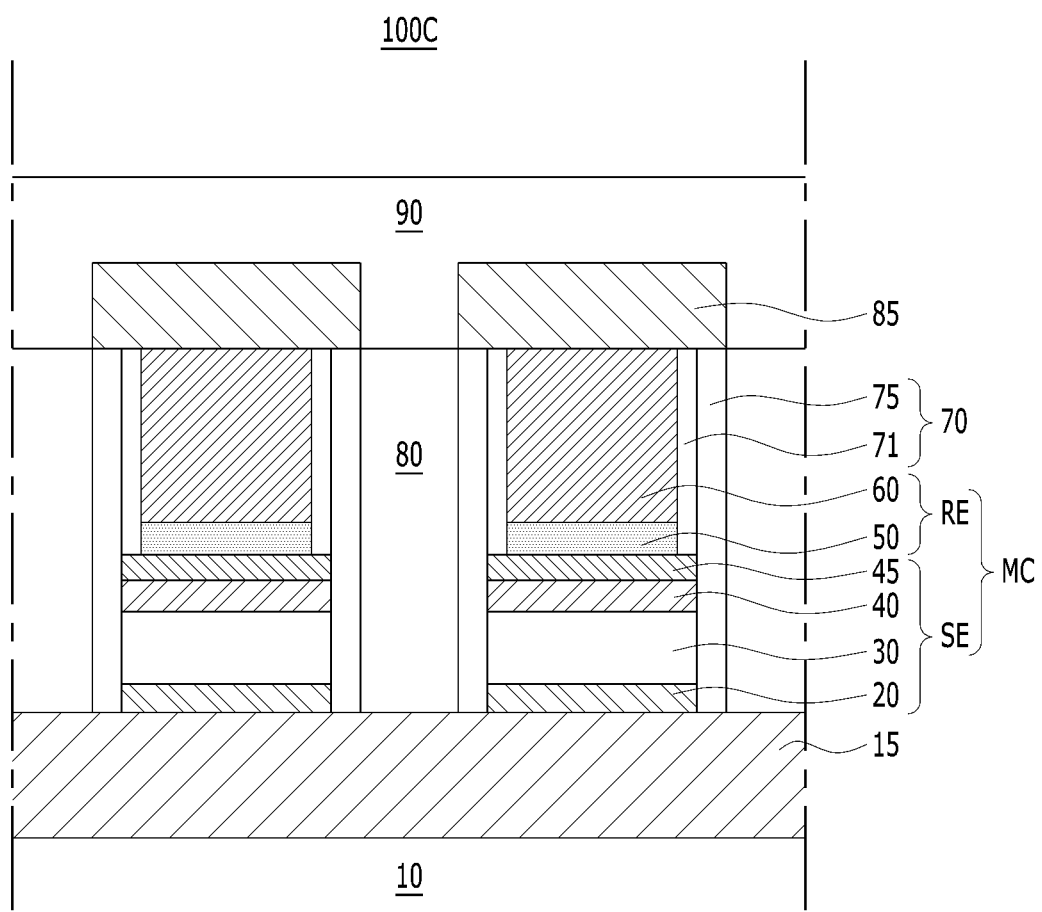

FIG. 3C is a longitudinal cross-sectional view taken along the line I-I' of FIG. 2, conceptually illustrating a variable resistance semiconductor device 100C in accordance with an embodiment of the disclosure. The variable resistance semiconductor device 100C may omit the reservoir pattern 55, when compared to the variable resistance semiconductor device 100A of FIG. 3A. That is to say, the variable resistance element pattern 50 and the top electrode 60 may be brought into direct contact with each other. The remaining components of variable resistance semiconductor device 100C are substantially the same or identical to those described above for variable resistance semiconductor device 100A, and so will not be repeated here to reduce repetition. The variable resistance element pattern 50 may include metal oxide such as hafnium oxide (HfxOy), tantalum oxide (TaxOy), titanium oxide (TixOy), zirconium oxide (ZrxOy), aluminum oxide (AlxOy), gadolinium oxide (GdxOy), lanthanum oxide (LaxOy) or ytterbium oxide (YbxOy) (where x and y are integers). The top electrode 60 may include a conductive barrier layer with an excellent adhesion force with respect to variable resistance element pattern 50, such as titanium nitride (TiN) or tantalum nitride (TaN).

Figure 3D:
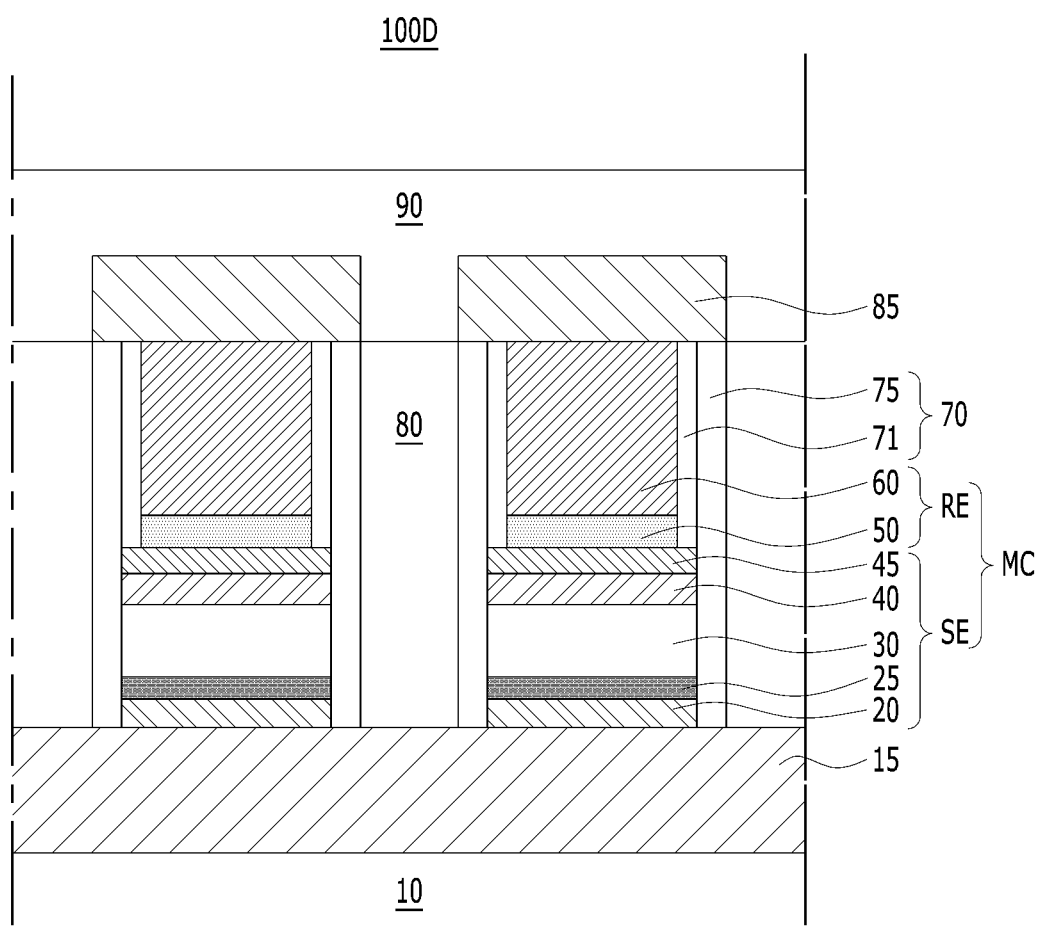

FIG. 3D is a longitudinal cross-sectional view taken along the line I-I' of FIG. 2, conceptually illustrating a variable resistance semiconductor device 100D in accordance with an embodiment of the disclosure. The variable resistance semiconductor device 100D may further include a resistive barrier layer 25 and omit the reservoir pattern 55, when compared to the variable resistance semiconductor device 100A of FIG. 3A. The remaining components of variable resistance semiconductor device 100D are substantially the same or identical to those described above for variable resistance semiconductor devices 100A, 100B and 100C, and so will not be repeated here to reduce repetition.

Figure 4:
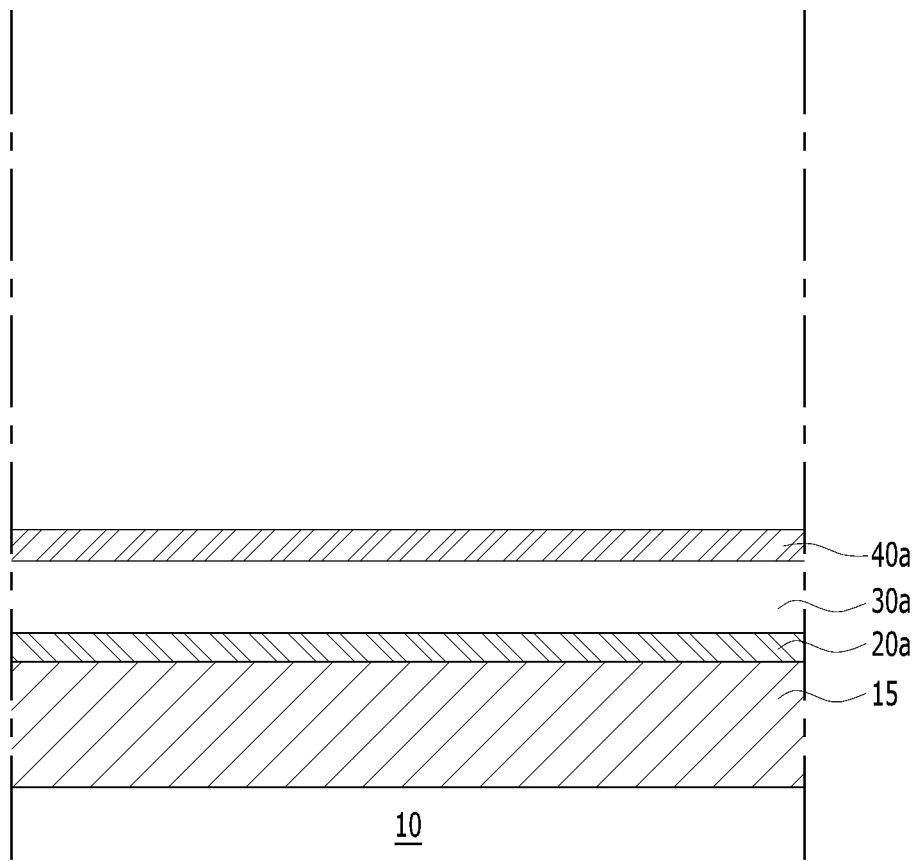
FIGS. 4 to 12 are representations of examples of cross-sectional views illustrating methods for forming a variable resistance semiconductor device in accordance with embodiments of the disclosure.

FIGS. 4 to 12 are cross-sectional views illustrating methods for forming a variable resistance semiconductor device in accordance with embodiments of the disclosure. Referring to FIG. 4, a method for forming a variable resistance semiconductor device in accordance with an embodiment of the disclosure may include forming a lower conductive wiring 15 on a lower layer 10, and sequentially forming a bottom electrode material layer 20a, a selection element material layer 30a and a lower intermediate electrode material layer 40a on the lower conductive wiring 15 by performing deposition processes.

The lower layer 10 may include a dielectric material layer which is formed on a substrate (not shown). For example, the lower layer 10 may include a silicon nitride (SiN) layer, a silicon oxide ($SiO_2$) layer, a silicon oxynitride (SiON) layer or another dielectric material layer, which is formed by performing a deposition process such as CVD (Chemical Vapor Disposition).

The lower conductive wiring 15 may be formed by performing a deposition process such as CVD or PVD (Physical Vapor Disposition) and a patterning process. Referring to FIG. 2, the lower conductive wiring 15 may be one among the plurality of word lines WL which extend in parallel or substantially in parallel in the first horizontal direction D1. The lower conductive wiring 15 may include a conductive material such as a doped silicon, a metal, a metal silicide, a metal compound or a metal alloy.

The selection element material layer 30a may include at least one among an Ovonic threshold switching (OTS) material layer, a Schottky diode, a metal-insulator-metal (MIM), a PN junction diode, a metal-insulator transition (MIT) material layer, a mixed ionic electronic conduction (MIEC) material layer and any other material capable of selectively blocking current flow, which is formed by performing a deposition process. In an embodiment of the disclosure, the selection element material layer 30a may be formed by doping arsenic (As) ions into a polycrystalline silicon layer.

The lower intermediate electrode material layer 40a may be formed by performing a CVD or PVD process. The lower intermediate electrode material layer 40a may include a conductor having an excellent adhesion force with the selection element material layer 30a. For example, the lower intermediate electrode material layer 40a may include a conductor having at least one of titanium (Ti), tantalum (Ta) and carbon (C). In non-limiting examples, the lower intermediate electrode material layer 40a may include titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) or amorphous carbon (α-C).

Figure 5:
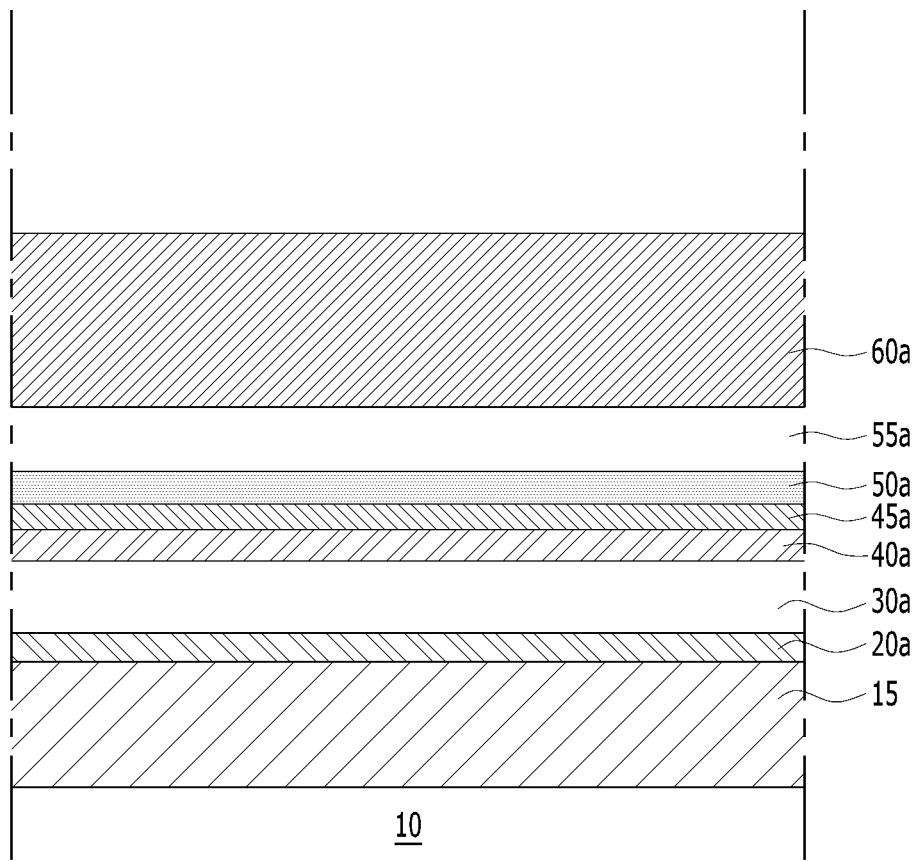

Referring to FIG. 5, the method may include forming an upper intermediate electrode material layer 45a, a resistance element material layer 50a, a reservoir material layer 55a and a top electrode material layer 60a on the lower intermediate electrode material layer 40a, by performing deposition processes such as CVD or PVD.

The upper intermediate electrode material layer 45a may include a metallic conductor having higher work function and/or oxidation resistance than the lower intermediate electrode material layer 40a. The upper intermediate electrode material layer 45a may include at least one among a metal such as ruthenium (Ru), cobalt (Co), palladium (Pd), nickel (Ni), rhenium (Re), iridium (Ir), platinum (Pt), aurum (Au), rhodium (Rh) or lead (Pb). As non-limiting examples, the upper intermediate electrode material layer 45a may include a metal oxide such as iridium oxide ($IrO_2$), ruthenium oxide ($RuO_2$) or rhenium oxide ($ReO_2$); a metal nitride such as titanium nitride (TiN), tantalum nitride (TaN), tungsten nitride (WN), tantalum silicon nitride (TaSiN) or titanium silicon nitride (TiSiN); a metal alloy containing ruthenium (Ru) such as ruthenium-hafnium (RuHf), ruthenium-tantalum (RuTa), ruthenium-titanium (RuTi) or ruthenium-zirconium (RuZr); a ruthenium silicide such as ruthenium-silicon (RuSi); a metal alloy containing iridium (Ir) such as iridium-hafnium (IrHf), iridium tantalum (IrTa), iridium-titanium (IrTi) or iridium-zirconium (IrZr); and an iridium silicide such as iridium-silicon (IrSi).

The resistance element material layer 50a may include a variable resistance material of which the resistance value varies depending on an oxygen content. For example, the resistance element material layer 50a may include at least one among a single-metal oxide (such as hafnium oxide ($HfO_2$), tantalum oxide ($Ta_2O_5$), titanium oxide ($TiO_2$), zirconium oxide ($ZrO_2$), aluminum oxide ($Al_2O_3$), gadolinium oxide ($Gd_2O_3$), lanthanum oxide ($La_2O_3$) or ytterbium oxide ($Yb_2O_3$), and silicon oxide ($SiO_2$)), or a complex-metal oxide containing at least two different metals (such as hafnium (Hf), tantalum (Ta), titanium (Ti), zirconium (Zr), tungsten (W), aluminum (Al), gadolinium (Gd), lanthanum (La), ytterbium (Yb) and iridium (Ir)).

The reservoir material layer 55a may include a redox metal such as tantalum (Ta) or titanium (Ti). In another embodiment of the disclosure, the reservoir material layer 55a may be omitted. That is to say, the top electrode material layer 60a may be directly formed on the resistance element material layer 50a. The resistance element material layer 50a may include metal oxide such as hafnium oxide (HfxOy), tantalum oxide (TaxOy), titanium oxide (TixOy), zirconium oxide (ZrxOy), aluminum oxide (AlxOy), gadolinium oxide (GdxOy), lanthanum oxide (LaxOy) or ytterbium oxide (Ybyx$_2$Oy) (where x and y are integers).

The top electrode material layer 60a may include a conductor having an excellent adhesion force with the reservoir material layer 55a. For example, the top electrode material layer 60a may include at least one among titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) and amorphous carbon (α-C).

Figure 6:
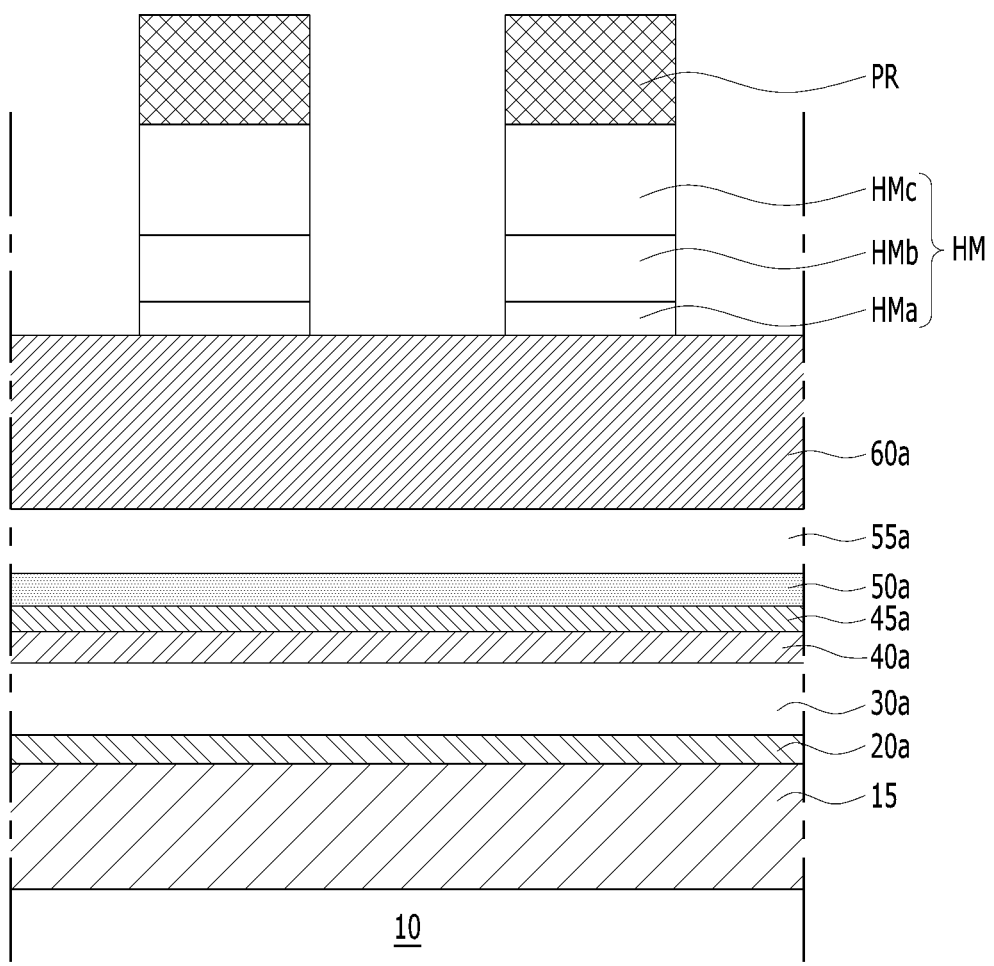

Referring to FIG. 6, the method may include forming a hard mask pattern HM by performing a deposition process and a patterning process on the top electrode material layer 60a. For example, the method may include forming a lower hard mask material layer, an intermediate hard mask material layer and an upper hard mask material layer on the top electrode material layer 60a, forming a photoresist pattern PR by performing a photolithography process, and forming the hard mask pattern HM including a lower hard mask pattern HMa, an intermediate hard mask pattern HMb and an upper hard mask pattern HMc by performing an etching process using the photoresist pattern PR as an etch mask. In an embodiment, the lower hard mask pattern HMa may include silicon nitride (SiN), the intermediate hard mask pattern HMb may include silicon oxide ($SiO_2$), and the upper hard mask pattern HMc may include polycrystalline silicon. The material used in the lower hard mask pattern HMa may be selected to reduce or prevent a chemical reaction with the top electrode material layer 60a. The material used in the intermediate hard mask pattern HMb may be chosen to be more flexible and softer than the materials used in the lower and upper hard mask patterns HMa and HMc. The material used in the upper hard mask pattern HMc may be selected to have a higher etching selectivity with the top electrode material layer 60a, the reservoir material layer 55a and the resistance element material layer 50a as compared to the lower and intermediate hard mask patterns HMa and HMb. Thereafter, the photoresist pattern PR may be removed. While it is described in the present embodiment that the hard mask pattern HM is formed into a three-layered structure, it is to be noted that the hard mask pattern HM may be a single layer or may include a larger number of material layers, such as four stacked layers.

Figure 7:
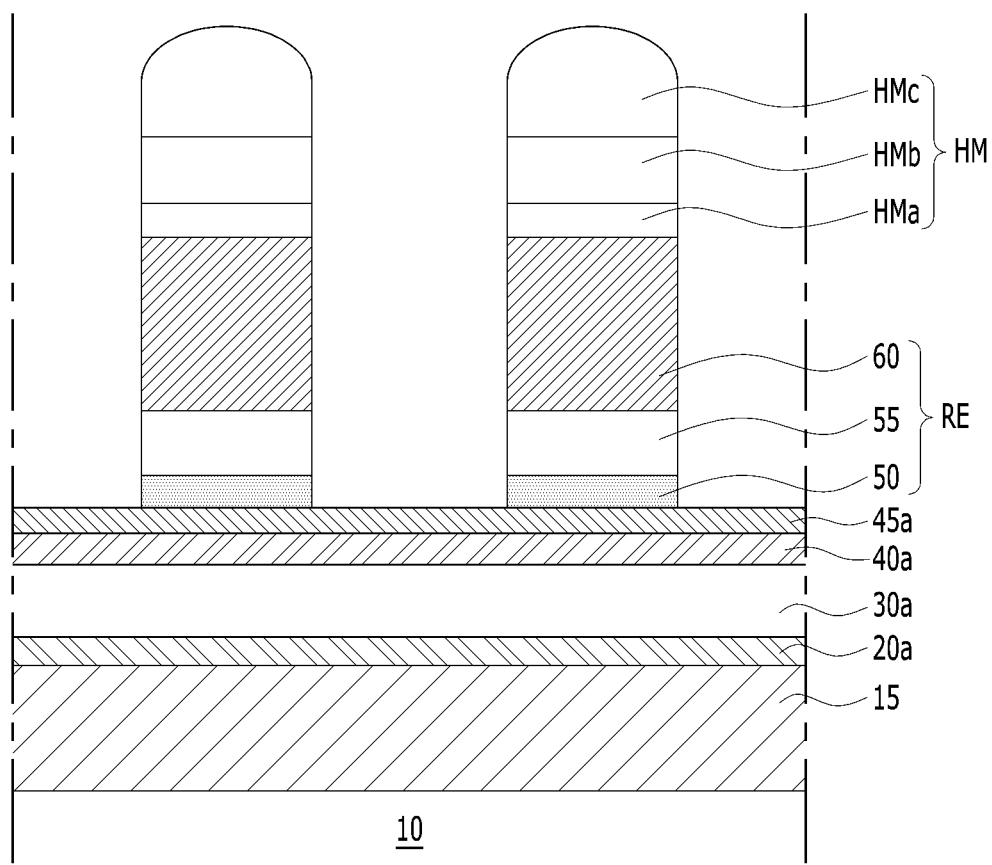

Referring to FIG. 7, the method may include forming a top electrode 60, a reservoir pattern 55 and a variable resistance element pattern 50 by successively etching the top electrode material layer 60a, the reservoir material layer 55a and the resistance element material layer 50a through performing etching processes using the hard mask pattern HM. In particular, the upper hard mask pattern HMc is used as an etch mask. In this process, a resistance element RE including the variable resistance element pattern 50, the reservoir pattern 55 and the top electrode 60 may be formed.

Figure 8:
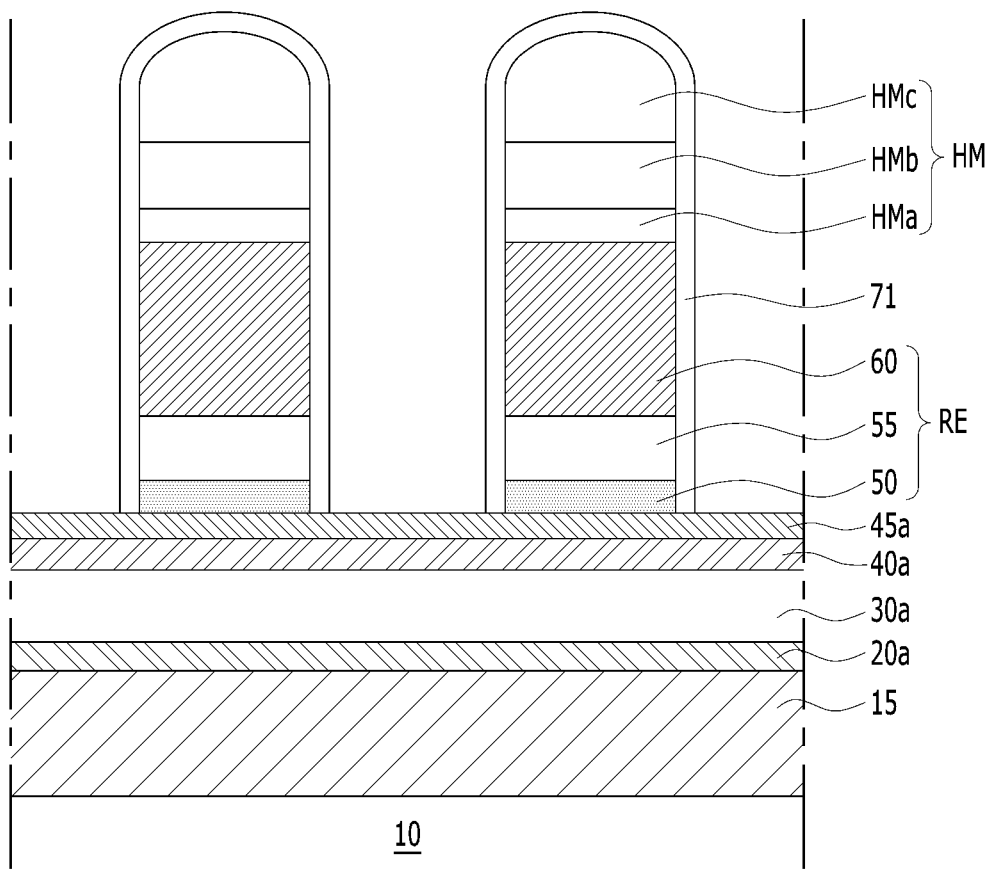

Referring to FIG. 8, the method may include forming an inner spacer 71 which is conformally formed on the outer surfaces and upper surface of the hard mask pattern HM, as well as the side or outer surfaces of the top electrode 60, the reservoir pattern 55 and the variable resistance element pattern 50, by conformally forming a silicon nitride (SiN) layer in a blanket-like manner and performing a blanket etching process such as an etch-back. The inner spacer 71 may prevent the exposed side surfaces of the reservoir pattern 55 and the variable resistance element pattern 50 from being attacked chemically and/or physically. For example, the inner spacer 71 may prevent the exposed side surfaces of the reservoir pattern 55 and the variable resistance element pattern 50 from being oxidized.

Figure 9:
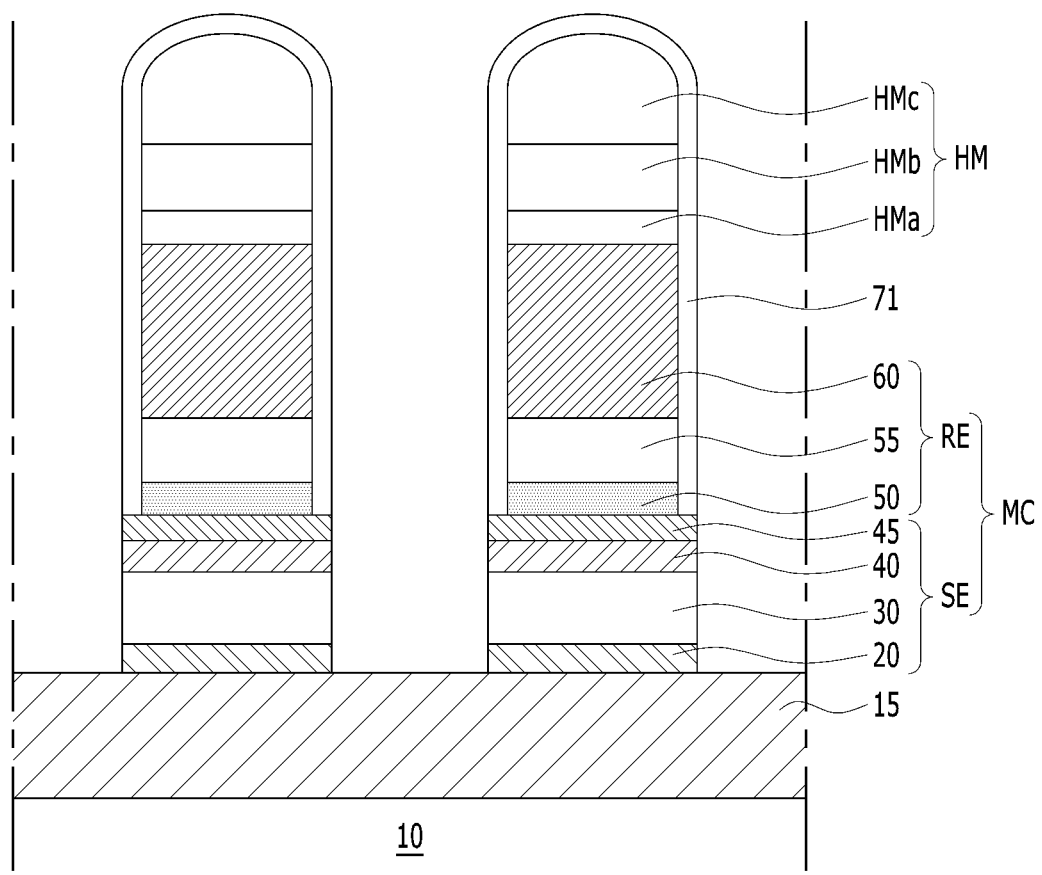

Referring to FIG. 9, the method may include forming an upper intermediate electrode 45, a lower intermediate electrode 40, a selection element pattern 30 and a bottom electrode 20 by sequentially etching the upper intermediate electrode material layer 45a, the lower intermediate electrode material layer 40a, the selection element material layer 30a and the bottom electrode material layer 20a through performing an etching process using the inner spacer 71 and the hard mask pattern HM as an etch mask. Therefore, the side surfaces of the inner spacer 71, the upper intermediate electrode 45, the lower intermediate electrode 40, the selection element pattern 30 and the bottom electrode 20 may be substantially vertically aligned or substantially flush. In this process, a selection element SE including the bottom electrode 20, the selection element pattern 30, the lower intermediate electrode 40 and the upper intermediate electrode 45 may be formed. Thus, a memory cell stack MC including the selection element SE and the resistance element RE may be formed.

Figure 10:
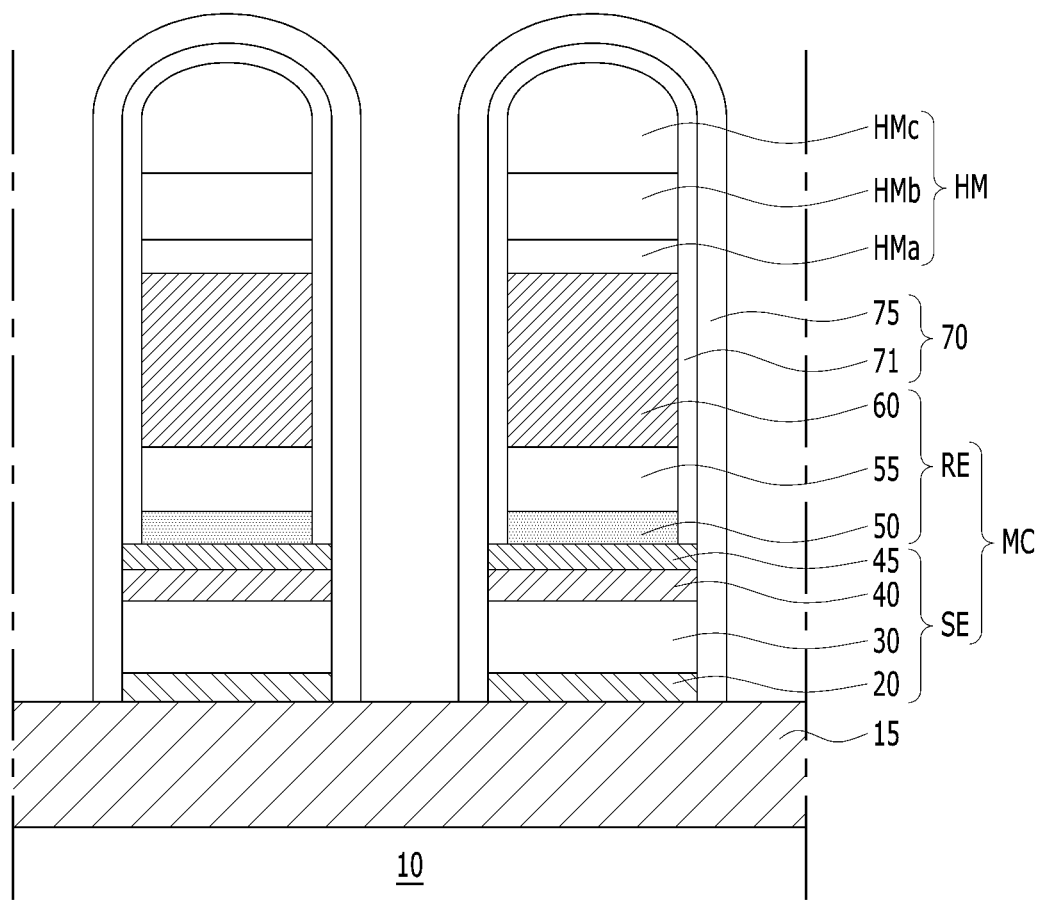

Referring to FIG. 10, the method may include forming an outer spacer 75 which is conformally formed on the side surfaces and upper surface of the inner spacer 71, and on the side or outer surfaces of the upper intermediate electrode 45, the lower intermediate electrode 40, the selection element pattern 30 and the bottom electrode 20, by conformally forming a silicon nitride (SiN) layer in a blanket-like manner and performing a blanket etching process such as an etch-back. The outer spacer 75 may prevent the exposed side surfaces of the upper intermediate electrode 45, the lower intermediate electrode 40, the selection element pattern 30 and the bottom electrode 20 from being attacked chemically and/or physically. For example, the outer spacer 75 may prevent the exposed side surfaces of the upper intermediate electrode 45, the lower intermediate electrode 40, the selection element pattern 30 and the bottom electrode 20 from being oxidated.

Figure 11:
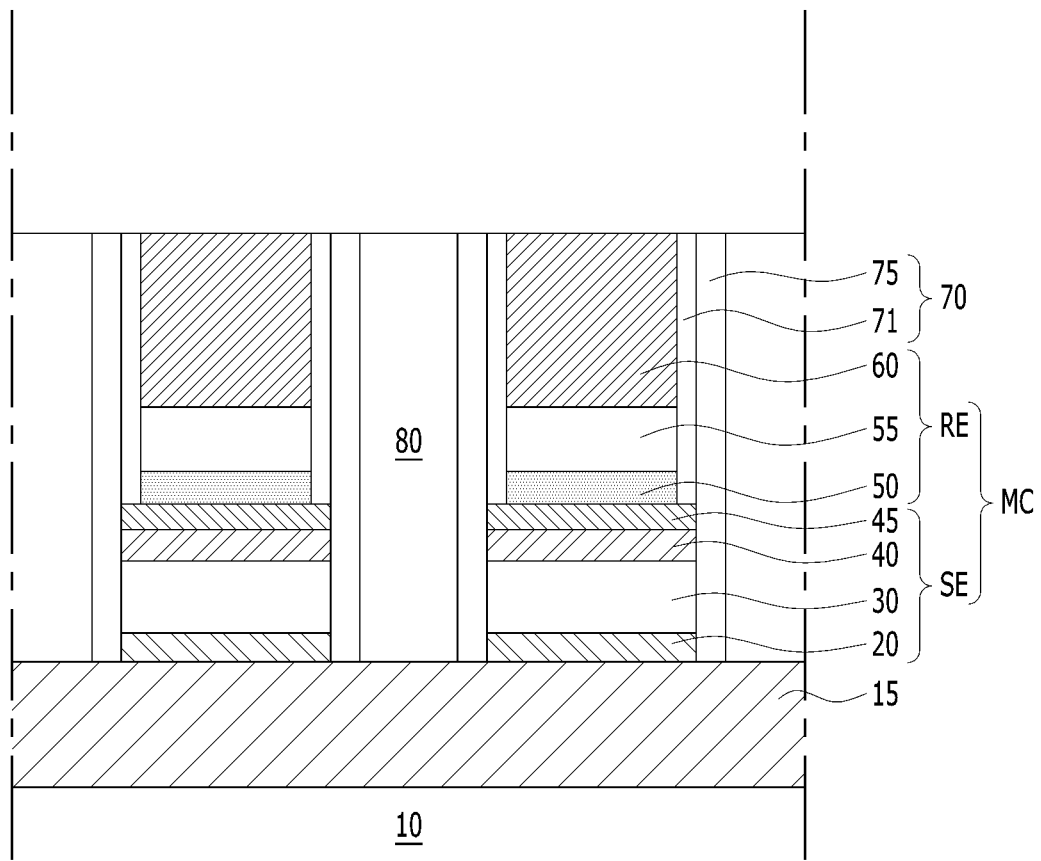

Referring to FIG. 11, the method may include exposing the upper surface of the top electrode 60 by forming an interlayer dielectric layer 80 to fill areas and gaps between memory cell stacks MC, and by removing the upper portions of the outer spacer 75 and the inner spacer 71 and the hard mask pattern HM through performing a planarization process such as CMP (Chemical Mechanical Polish).

Figure 12:
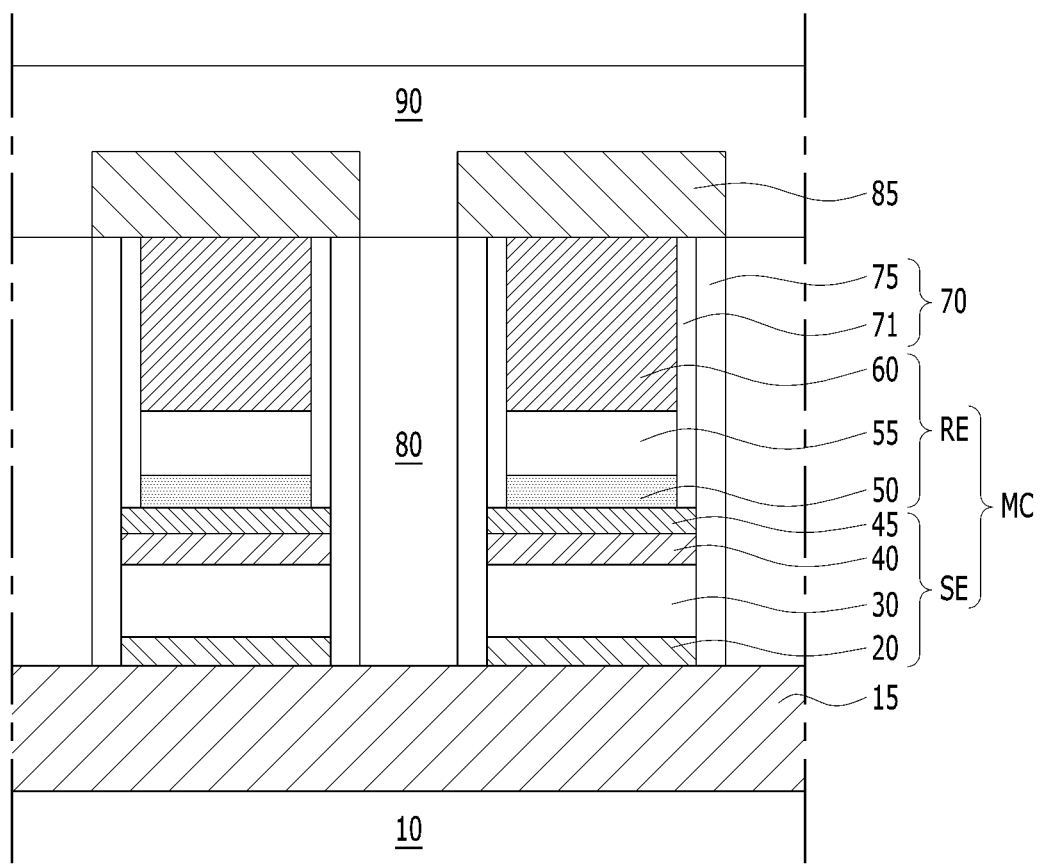

Referring to FIG. 12, the method may include forming an upper conductive wiring 85 on the upper surface of the top electrode 60 by performing a deposition process such as CVD or PVD and a patterning process. Referring to FIG. 2, the upper conductive wiring 85 may be one among the plurality of bit lines BL which extend in parallel in the second horizontal direction D2. The upper conductive wiring 85 may include a doped silicon, a metal, a metal silicide, a metal compound, a metal alloy or any other conductive material.

Then, additionally referring to FIG. 3A, the method may include forming a capping dielectric layer 90 which covers the upper conductive wiring 85, by performing a deposition process. The capping dielectric layer 90 may include silicon nitride (SiN), silicon oxide ($SiO_2$), silicon oxynitride (SiON) or any other dielectric material.

Although various embodiments have been described for illustrative purposes, it will be apparent to those skilled in the art that various changes and modifications may be made without departing from the spirit and scope of the invention as defined in the following claims.

What is claimed is:

1. A variable resistance semiconductor device comprising:
   a lower conductive wiring;
   a bottom electrode disposed on the lower conductive wiring;
   a selection element pattern disposed on the bottom electrode;
   a first intermediate electrode disposed on the selection element pattern;
   a second intermediate electrode disposed on the first intermediate electrode;
   a variable resistance element pattern disposed on the second intermediate electrode;
   a top electrode disposed on the variable resistance element pattern;
   an upper conductive wiring disposed on the top electrode; and
   a first spacer formed on sidewalls of the top electrode and the variable resistance element pattern,
   wherein side surfaces of the bottom electrode, the selection element pattern, the first intermediate electrode, and the second intermediate electrode are aligned with an outer surface of the first spacer to form a pillar-like structure between the lower conductive wiring and the upper conductive wiring,
   wherein the first intermediate electrode includes a first material with a first oxidation resistance and a first work function,
   wherein the second intermediate electrode includes a second material with a second oxidation resistance and a second work function,
   wherein the second oxidation resistance is greater than the first oxidation resistance and the second work function is higher than the first work function, and
   wherein the bottom electrode, the selection element pattern, the first intermediate electrode, the second intermediate electrode, the variable resistance element pattern and the top electrode are included in a single memory cell.

2. The variable resistance semiconductor device according to claim 1, wherein the first material includes at least one among titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) and amorphous carbon (α-C).

3. The variable resistance semiconductor device according to claim 1, wherein the second material includes ruthenium (Ru), cobalt (Co), palladium (Pd), nickel (Ni), rhenium (Re), iridium (Ir), platinum (Pt), aurum (Au), rhodium (Rh), lead (Pb), iridium oxide (IrO2), ruthenium oxide (RuO2), rhenium oxide (ReO2), titanium nitride (TiN), tantalum nitride (TaN), tungsten nitride (WN), tantalum silicon nitride (TaSiN), titanium silicon nitride (TiSiN), ruthenium-hafnium (RuHf), ruthenium-tantalum (RuTa), ruthenium-titanium (RuTi), ruthenium-zirconium (RuZr), ruthenium-silicon (RuSi), iridium-hafnium (IrHf), iridium tantalum (IrTa), iridium-titanium (IrTi), iridium-zirconium (IrZr), or iridium-silicon (IrSi).

4. The variable resistance semiconductor device according to claim 1, wherein the bottom electrode includes one among titanium nitride (TiN), titanium carbon nitride (TiCN), titanium aluminum nitride (TiAlN), titanium silicon nitride (TiSiN), tantalum nitride (TaN), tantalum carbon nitride (TaCN), tantalum silicon nitride (TaSiN), tantalum titanium nitride (TaTiN), carbon (C) and amorphous carbon (α-C).

5. The variable resistance semiconductor device according to claim 1, wherein the selection element pattern includes one among an Ovonic threshold switching (OTS) material layer, a Schottky diode, a metal-insulator-metal (MIM), a PN junction diode, a metal-insulator transition (MIT) material layer, a mixed ionic electronic conduction (MIEC) material layer and a silicon doped with arsenic (As) ions.

6. The variable resistance semiconductor device according to claim 1, wherein the variable resistance element pattern includes one among hafnium oxide (HfO2), tantalum oxide (Ta2O5), titanium oxide (TiO2), zirconium oxide (ZrO2), aluminum oxide (Al2O3), gadolinium oxide (Gd2O3), lanthanum oxide (La2O3), or ytterbium oxide (Yb2O3), silicon oxide (SiO2); a metal oxide containing at least two metals among hafnium (Hf), tantalum (Ta), titanium (Ti), zirconium (Zr), tungsten (W), aluminum (Al), gadolinium (Gd), lanthanum (La), ytterbium (Yb) and iridium (Ir); a chalcogenide-based alloy; or a conductive bridge RAM (CBRAM) material.

7. The variable resistance semiconductor device according to claim 1, further comprising:
a reservoir pattern disposed between the variable resistance element pattern and the top electrode,
wherein the reservoir pattern includes one among hafnium (Hf), tantalum (Ta), titanium (Ti), silicon (Si), titanium oxide (TiOx), and tungsten (W).

8. The variable resistance semiconductor device according to claim 1, further comprising:
a resistive barrier layer disposed between the bottom electrode and the selection element pattern,
wherein the resistive barrier layer includes an oxide containing at least one among silicon (Si), hafnium (Hf), tantalum (Ta), titanium (Ti), zirconium (Zr) and aluminum (Al).

9. The variable resistance semiconductor device according to claim 1,
wherein the first spacer includes a dielectric material.

10. The variable resistance semiconductor device according to claim 9, further comprising:

a second spacer formed on sidewalls of the bottom electrode, the selection element pattern, the first intermediate electrode, the second intermediate electrode and the first spacer,
wherein the second spacer includes a dielectric material.

11. A variable resistance semiconductor device comprising:
a lower conductive wiring;
a bottom electrode disposed on the lower conductive wiring;
a selection element pattern disposed on the bottom electrode;
a lower intermediate electrode disposed on the selection element pattern;
an upper intermediate electrode disposed on the lower intermediate electrode;
a variable resistance element pattern disposed on the upper intermediate electrode;
a top electrode disposed on the variable resistance element pattern;
an upper conductive wiring disposed on the top electrode; and
an adhesion layer between the lower intermediate electrode and the selection element pattern,
wherein the lower intermediate electrode includes titanium nitride or amorphous carbon,
wherein the upper intermediate electrode includes ruthenium or ruthenium oxide, and
wherein the bottom electrode, the selection element pattern, the lower intermediate electrode, the upper intermediate electrode, the variable resistance element pattern and the top electrode are included in a single memory cell.

12. The variable resistance semiconductor device according to claim 11, wherein the bottom electrode includes titanium nitride (TiN) or amorphous carbon (α-carbon).

13. The variable resistance semiconductor device according to claim 11, further comprising:
a reservoir pattern disposed between the variable resistance element pattern and the top electrode,
wherein the reservoir pattern includes one among hafnium (Hf), tantalum (Ta), titanium (Ti), silicon (Si), titanium oxide (TiOx), and tungsten (W).

14. The variable resistance semiconductor device according to claim 11, further comprising:
a resistive barrier layer disposed between the bottom electrode and the selection element pattern,
wherein the resistive barrier layer includes an oxide containing at least one among silicon (Si), hafnium (Hf), tantalum (Ta), titanium (Ti), zirconium (Zr) and aluminum (Al).

15. The variable resistance semiconductor device according to claim 11, further comprising:
a first spacer formed on sidewalls of the top electrode and the variable resistance element pattern; and
a second spacer formed on sidewalls of the bottom electrode, the selection element pattern, the lower intermediate electrode, the upper intermediate electrode and the first spacer,
wherein the first and second spacers include a dielectric material.

16. A method of forming a variable resistance memory device, the method comprising
forming a lower conductive wiring;
forming a bottom electrode over the lower conductive wiring;

forming a selection element pattern over the bottom electrode;

forming a lower intermediate electrode over the selection element pattern;

forming an upper intermediate electrode over the lower intermediate electrode;

forming a variable resistance element pattern over the upper intermediate electrode;

forming a top electrode over the variable resistance element pattern;

forming a first spacer formed on sidewalls of the top electrode and the variable resistance element pattern; and forming an upper conductive wiring over the top electrode, wherein side surfaces of the bottom electrode, the selection element pattern, the first intermediate electrode, and the second intermediate electrode are aligned with an outer surface of the first spacer to form a pillar-like structure between the lower conductive wiring and the upper conductive wiring, wherein the upper intermediate electrode has a better oxidation resistance and a higher work function than the lower intermediate electrode, and wherein the bottom electrode, the selection element pattern, the lower intermediate electrode, the upper intermediate electrode, the variable resistance element pattern and the top electrode are included in a single memory cell.

17. The method according to claim 16, further comprising:

forming a reservoir pattern between the variable resistance element pattern and the top electrode, wherein the reservoir pattern includes one among hafnium (Hf), tantalum (Ta), titanium (Ti), silicon (Si), titanium oxide (TiOx), and tungsten (W).

18. The method according to claim 16, the method further comprising:

forming a resistive barrier layer between the bottom electrode and the selection element pattern, wherein the resistive barrier layer includes an oxide containing at least one among silicon (Si), hafnium (Hf), tantalum (Ta), titanium (Ti), zirconium (Zr) and aluminum (Al).

19. The method according to claim 16, wherein the upper intermediate electrode comprises RuO2.

20. The method according to claim 19, wherein the lower intermediate electrode comprises titanium nitride.

21. A method of forming a variable resistance memory device, the method comprising forming a selection element comprising a lower electrode, a selection element pattern and an intermediate electrode;

forming a resistance element comprising a variable resistance element pattern, a reservoir pattern and a top electrodes; and forming a first spacer formed on sidewalls of the top electrode and the variable resistance element pattern, wherein side surfaces of the bottom electrode, the selection element pattern, the first intermediate electrode, and the second intermediate electrode are aligned with an outer surface of the first spacer to form a pillar-like structure between the lower conductive wiring and the upper conductive wiring, wherein the intermediate electrode is comprised of a lower intermediate electrode and an upper intermediate electrode, wherein the upper intermediate electrode comprises ruthenium oxide (RuO2), and wherein the selection element and the resistance element are included in a single memory cell.

22. The method according to claim 21, wherein the lower intermediate electrode comprises a metal with a lower work function and a lower oxidation resistance compared to ruthenium oxide (RuO2).

23. The method according to claim 21, wherein the lower intermediate electrode comprises titanium nitride.

* * * * *